United States Patent [19]

Nakagawa

[11] Patent Number: 5,126,288
[45] Date of Patent: Jun. 30, 1992

[54] FINE PROCESSING METHOD USING OBLIQUE METAL DEPOSITION

[75] Inventor: Yoshikazu Nakagawa, Kyoto, Japan

[73] Assignee: Rohm Co., Ltd., Kyoto, Japan

[21] Appl. No.: 645,215

[22] Filed: Jan. 24, 1991

[30] Foreign Application Priority Data

Feb. 23, 1990 [JP] Japan .................. 2-42857

[51] Int. Cl.[5] .................. H01L 21/465; H01L 21/30
[52] U.S. Cl. .................................. 437/228; 437/50
[58] Field of Search ............ 148/DIG. 51, DIG. 105; 437/228, 67, 944, 80, 203; 156/659.1, 644

[56] References Cited

U.S. PATENT DOCUMENTS

| | | | |
|---|---|---|---|
| 4,525,919 | 7/1985 | Fabian | 437/80 |
| 4,546,538 | 10/1985 | Suzuki | 437/80 |
| 4,618,510 | 10/1986 | Tan | 156/659.1 |
| 4,629,686 | 7/1985 | Kraus | 156/659.1 |
| 4,849,376 | 7/1989 | Balzan et al. | 437/179 |

FOREIGN PATENT DOCUMENTS

| | | | |
|---|---|---|---|
| 0153349 | 9/1983 | Japan | 437/67 |
| 0133739 | 7/1985 | Japan | 437/67 |
| 89/07333 | 8/1989 | PCT Int'l Appl. | |

Primary Examiner—Olik Chaudhuri
Assistant Examiner—Loc Q. Trinh
Attorney, Agent, or Firm—Brumbaugh, Graves, Donohue & Raymond

[57] ABSTRACT

A resist pattern having a prescribed opening is formed over a semiconductor substrate through an insulative layer. A Ti film is formed, by oblique vacuum vapor deposition, on the resist pattern and on part of the area of the insulative layer which constitutes the bottom surface of the resist opening. The insulative film is etched using the Ti film as a mask to form a groove through the insulative layer.

5 Claims, 1 Drawing Sheet

FINE PROCESSING METHOD USING OBLIQUE METAL DEPOSITION

BACKGROUND OF THE INVENTION

The present invention relates to a fine processing method, and more specifically relates to a fine processing method for producing semiconductor devices.

In order to produce semiconductor devices, such as MESFETs and HEMTs, used in the microwave frequency range, it is required to form, for example in a gate forming process, fine grooves of 0.5 μm or less in width on a substrate, and therefore to form a resist pattern having fine lines of 0.5 μm or less in width. Usual photo-exposure methods cannot provide such a fine resist pattern due to the limitation originating from the minimum wavelength of exposure light.

Therefore, electron beam exposure methods, focused ion beam methods, etc. have conventionally been employed to form such fine resist patterns. However, these methods have a disadvantage of very long exposure time, resulting in low productivity.

SUMMARY OF THE INVENTION

An object of the present invention is to solve the above problems of the prior art, and to provide a fine processing method which can readily form fine grooves on a substrate.

According to the invention, a method of forming a groove through a layer formed on a substrate, comprises the steps of:
forming a layer on a substrate;
forming a resist pattern having a prescribed opening on the layer;
depositing, by vacuum vapor deposition in a direction oblique from a vertical direction to the substrate, a metal material to form a metal film on the resist pattern and on a part of an area of the layer, the area constituting a bottom surface of the opening of the resist pattern; and
etching the layer using the deposited metal film as a mask to form a groove through the layer.

With the above method, by properly selecting a parameter such as an angle of the oblique deposition and a thickness of the resist pattern, part of the exposed area of the layer, which area constitutes the bottom surface of the resist opening, can be shielded by the resist pattern and prevented from deposition of the metal material. By etching the layer using the deposited metal film as a mask, the groove is formed in the area of the layer which is not covered with the deposited metal film.

DETAILED DESCRIPTION OF THE PREFERRED EMBODIMENTS

An embodiment of the present invention is described with reference to the drawings. FIGS. 1(a) through 1(f) are sectional views showing production steps according to an embodiment of the invention.

Figure 1A:
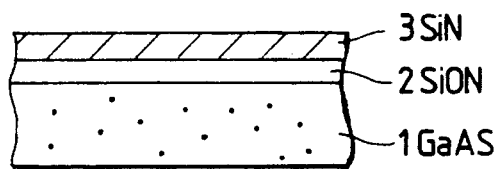
FIGS. 1(a) through 1(f) are sectional views showing production steps of a fine processing method according to an embodiment of the present invention.
Figure 1D:
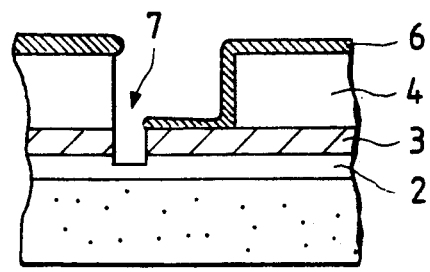

First, in step (a), an SiON layer 2 and an SiN layer 3 are sequentially formed on a GaAs substrate 1 (FIG. 1(a)).

Figure 1B:
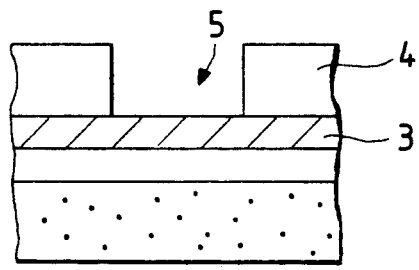

In step (b), a resist pattern 4 having a prescribed opening 5 is formed on the SiN layer 3 using a usual photoexposure method (FIG. 1(b)). The resist pattern 4 may be formed using other exposure methods because the opening 5 may be of any size, for example, more than 0.5 μm.

Figure 1E:
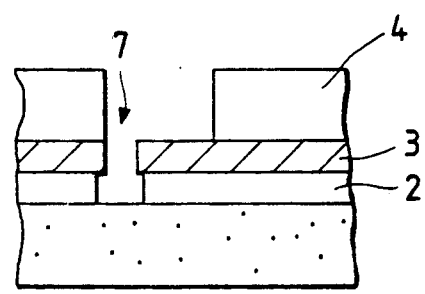
Figure 1C:
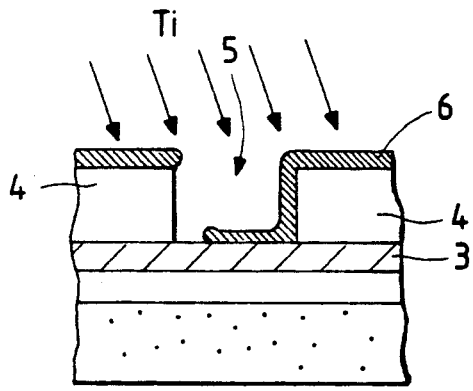

In step (c), a Ti film 6 is formed by oblique vacuum vapor deposition not only on the resist pattern 4 but also on part of the exposed area of the SiN layer 3, which area constitutes the bottom surface of the opening 5 (FIG. 1(c)). The remaining part of the exposed area of the SiN layer 3 is prevented from the Ti deposition, because, in the embodiment, it is shielded by the left-side resist pattern 4 from the flow of Ti atoms coming from the upper-left of the drawing. As a result, a certain area of the exposed SiN layer 3, which is adjacent to the side edge of the left-side resist pattern 4, remains uncovered with the Ti film 6. The size (width) of the uncovered area can be changed properly by selecting the deposition angle, thickness of the resist pattern 4, and other parameters. For example, if it is assumed that the width of the opening 5 is constant along the thickness-direction of the resist pattern 4, the width of the uncovered SiN area decreases as the direction of the oblique deposition approaches the vertical direction to the SiN layer 3, or as the resist pattern 4 becomes thinner. It is noted that Al or Ni may be employed, instead of Ti, as the deposition material.

In step (d), reactive ion etching (RIE) is performed, with the Ti film 6 as a mask, using a fluoride gas such as $CF_4$, $CHF_3$, $SF_6$, etc. (FIG. 1(d)). The Ti film 6, resist pattern 4 and SiN layer 3 are etched with different etching speed from one another. That is, the Ti film 6 and resist pattern 4 is hardly etched compared with the SiN layer 3. Therefore, a groove 7 is formed having a width substantially equal to the width of the SiN area which was not covered with the Ti film 6. Although the SiON layer 2 is also etched in this process, this small etching incurs no problem because the SiON layer 2 is further etched in subsequent step (e).

In step (e), the Ti film 6 is removed by etching using hydrofluoric acid as an etchant (FIG. 1(e)). In this etching process, etching speed of the Ti film 6, SiN layer 3 and SiON layer 2 are different from one another. That is, the SiN layer 3 is hardly etched compared with the Ti film 6 and SiON layer 2. Therefore, the width of the groove 7 remains almost unchanged. It is noted that, in the embodiment, side etching is performed with respect to the SiON layer 2 so that the groove 7 is applicable to the subsequent gate formation.

Figure 1F:
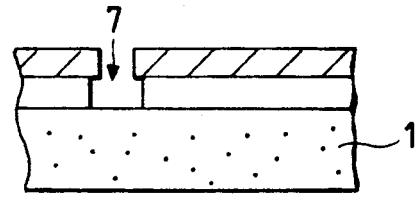

In step (f), the resist pattern 4 is removed by a usual method (FIG. 1(f)) to complete the formation of the fine groove 7 which exposes part of the GaAs substrate 1.

Through the groove 7 thus formed, various fine processes can be applied to the GaAs substrate 1. For example, gate metal may be deposited on the GaAs substrate 1 by perpendicular vacuum vapor deposition through the groove 7 to form a gate electrode which is much finer than gate electrodes formed by conventional photo-exposure methods. Further, ion injection may be performed with respect to fine regions in the GaAs substrate 1 using the groove 7 as a mask.

As described above, according to the fine processing method of the invention, part of the exposed area of a layer formed on a substrate, which area constitutes the bottom surface of a resist opening, is covered with a deposition film by oblique vacuum vapor deposition. Since subsequent etching is performed using the deposition film as a mask, a fine groove can be readily formed through the layer, even if the resist opening has a size comparable to the size which would be obtained with photo-exposure methods.

Since manufacturing devices used in conventional photoexposure methods, oblique vacuum vapor deposition, etc. are applicable to the above-described method, fine grooves can be formed relatively easily in a short time. As a result, it becomes possible to readily produce semiconductor devices such as MESFETs and HEMTs, which contributes to high productivity and therefore to mass-production of inexpensive semiconductor devices of such kind.

What is claimed is:

1. A method of forming a groove through an insulative layer on a supporting substrate comprising
   (a) providing a supporting substrate;
   (b) forming a composite insulative layer on the substrate including an SiON layer on the substrate and an SiN layer on the SiON layer;
   (c) forming a resist layer having a prescribed opening on the composite layer;
   (d) depositing, by vacuum vapor deposition in a direction oblique from the vertical direction to the supporting substrate, a metal material to form a metal film on the resist pattern and on a part of the composite layer at the bottom surface of the opening in the resist pattern;
   (e) etching the SiN layer by reactive ion etching using the deposited metal film as a mask; and
   (f) etching to remove the metal film and to side etch the SiON layer.

2. The method according to claim 1, wherein the metal material is titanium.

3. The method according to claim 1, wherein in the last step the metal film and the SiON layer is etched with hydrofluoric acid.

4. The method according to claim 1, further comprising the step of removing the resist pattern.

5. The method according to claim 1, wherein the substrate is a semiconductor substrate.

* * * * *